United States Patent
Chung et al.

(10) Patent No.: US 6,349,103 B1
(45) Date of Patent: Feb. 19, 2002

(54) COLD-START WAVELENGTH-DIVISION-MULTIPLEXED OPTICAL TRANSMISSION SYSTEM

(75) Inventors: Yun-Chur Chung; Jin-Hwan Jang; Seung-Kyun Shin, all of Daejeonkwangyeok; Hoon Kim, Goyang; Keun-Joo Park, Molopo; Kwan-Seop Lee, Incheonkwangyeok, all of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/473,021

(22) Filed: Dec. 28, 1999

Related U.S. Application Data (63) Continuation-in-part of application No. 08/964,568, filed on Nov. 5, 1997, now abandoned.

(30) Foreign Application Priority Data

May 7, 1997 (KR) .............................................. 97-17558

(51) Int. Cl.$^7$ ................................................. H01S 3/10
(52) U.S. Cl. .......................................... 372/32; 372/20
(58) Field of Search .............................. 372/32, 20, 34

(56) References Cited

U.S. PATENT DOCUMENTS

| | | | |
|---|---|---|---|
| 4,635,246 A | 1/1987 | Taylor et al. ................... | 370/3 |
| 4,813,756 A | 3/1989 | Frenkel et al. ............ | 350/96.18 |
| 4,930,855 A | 6/1990 | Clark et al. ............... | 350/96.19 |
| 5,119,454 A | 6/1992 | McMahon ................... | 385/49 |
| 5,283,845 A | 2/1994 | Ip ................................. | 385/24 |
| 5,305,134 A | 4/1994 | Tsushima et al. ............ | 359/192 |
| 5,387,992 A | 2/1995 | Miyazaki et al. ............ | 359/124 |
| 5,434,877 A | 7/1995 | Chung .......................... | 372/32 |
| 5,438,579 A | 8/1995 | Eda et al. ...................... | 372/34 |
| 5,469,288 A | 11/1995 | Onaka et al. ................ | 359/189 |
| 5,557,439 A | 9/1996 | Alexander et al. ........... | 359/130 |
| 5,566,018 A | 10/1996 | Lee et al. .................... | 359/341 |
| 5,589,969 A | 12/1996 | Taga et al. ................... | 359/124 |
| 5,606,573 A | 2/1997 | Tsang .......................... | 372/96 |
| 6,233,261 B1 * | 5/2001 | Mesh et al. .................... | 372/32 |

* cited by examiner

Primary Examiner—James W. Davie
(74) Attorney, Agent, or Firm—Robert E. Bushnell, Esq.

(57) ABSTRACT

A cold-start wavelength-division-multiplexed (WDM) optical transmission system uses a synchronized etalon filter, DFB lasers and passive optical demultiplexers. The DFB lasers are tested under normal operating conditions and wavelength-selected for each channel. The wavelength selection is such that the laser operates within one half of the channel spacing from the standardized wavelength. For the cold-start operation, each laser is able to automatically find its operating wavelength without any prior knowledge of its operating conditions for the standardized wavelength. In addition, this system simultaneously adjusts the output power of each laser to a desired value. Also provided is a method for generating standardized frequencies for a wavelength-division-multiplexed optical transmission system, including the step of adjusting the incident angle of an etalon filter by employing two frequency-locked lasers to compensate for differences of the thickness and refractive index of the etalon filter, and the step of fixing the position of the etalon filter to permanently have the adjusted incident angle, the etalon filter having resonant frequencies respectively corresponding to standardized frequencies.

22 Claims, 7 Drawing Sheets

COLD-START WAVELENGTH-DIVISION-MULTIPLEXED OPTICAL TRANSMISSION SYSTEM

CROSS-REFERENCE TO RELATED APPLICATIONS

This application is a continuation-in-part of Applicant's Ser. No. 08/964,568, filed in the U.S. Patent & Trademark Office on Nov. 5, 1997, now abandoned.

CLAIM OF PRIORITY

This application makes reference to, incorporates the same herein, and claims all benefits accruing under 35 U.S.C. §119 and §120 from an application for A COLD-START WAVELENGTH-DIVISION-MULTIPLEXED OPTICAL TRANSMISSION SYSTEM AND METHOD FOR GENERATING STANDARD WAVELENGTHS THEREFOR earlier filed in the Korean Industrial Property Office on May 7, 1997 and there duly assigned Serial No. 17558/1997.

BACKGROUND OF THE INVENTION

1. Field of the Invention

The present invention concerns a cold-start wavelength-division-multiplexed (WDM) optical transmission system and method for generating standard wavelengths used therefor.

2. Description of the Related Art

The WDM system is used to multiplex a plurality of transmitter lasers on a single optical fiber, considerably increasing the transmission capacity per optical fiber even if the lasers operate at low speed. Hence, it enables the transmission capacity to be increased without replacing the embedded single-mode fiber with a distributed transition optical fiber. However, WDM systems require each transmitter laser to operate at a specific wavelength to the end of the systems' lifetime. Proposals to standardize these wavelengths are currently being reviewed by the International Telecommunication Union (ITU). Therefore, all the lasers to be used in WDM systems will be operated at the standard frequencies recommended by the ITU.

At present, practical WDM system use distributed feedback (DFB) lasers as the existing optical transmission system since various types of tunable lasers have yet to show the required reliability, manufacturability and mode stability. However, DFB lasers have limited wavelength tunability and are difficult to manufacture to precise standardized wavelengths. Thus, DFB lasers must be "wavelength-selected" for each channel, and then tuned by temperature to operate at the standardized wavelengths. Once the DFB laser is tuned either in the factory or in the field, it must maintain the wavelength over the expected system's lifetime. However, because of aging, the wavelengths of some DFB lasers may drift up to a few tens of gigahertz even when their operating conditions such as bias current and temperature remain constant. This drift would result in the reduction of system margin and cause crosstalk. This may complicate the installation and maintenance of WDM systems. In particular, it could be disastrous if the wavelength of any laser must be changed in the field by unskilled technicians in order to restore the impaired transmission quality.

The following patents each disclose features in common with the present invention but do not teach or suggest the specifically recited cold-start wavelength division multiplexed optical transmission system and method of the present invention: U.S. Pat. No. 5,589,969 to Taga et al., entitled Wavelength Division Multiplexed Optical Fiber Transmission Equipment, U.S. Pat. No. 5,606,573 to Tsang, entitled Method And Apparatus For Control Of Lasing Wavelength In Distributed Feedback Lasers, U.S. Pat. No. 5,469,288 to Onaka et al., entitled Optical Filter, Method Of Controlling Transmission Wavelength Thereof, And Optical Receiver Using The Method, U.S. Pat. No. 5,557,439 to Alexander et al., entitled Expandable Wavelength Division Multiplexed Optical Communications Systems, U.S. Pat. No. 5,566,018 to Lee et al., entitled Apparatus For Adjusting Channel Width Of Multi-Channel Fiber Amplifier Light Source, U.S. Pat. No. 5,387,992 to Miyazaki et al., entitled Optical Frequency Multiplex Carrier Control System, U.S. Pat. No. 5,305,134 to Tsushima et al., entitled Optical Frequency Division Multiplexing Transmitter And Optical Frequency Division Multiplexing Transmission Apparatus, U.S. Pat. No. 4,635,246 to Taylor et al., entitled Frequency/Multiplex System Using Injection Locking Of Multiple Laser Diodes, U.S. Pat. No. 4,930,855 to Clark et al., entitled Wavelength Multiplexing Of Lasers, U.S. Pat. No. 4,813,756 to Frenkel et al., entitled Etalon Filters For Optical Channel Selection In Wavelength Division Multiplexed Fiber Systems, U.S. Pat. No. 5,119,454 to McMahon, entitled Bulk Optic Wavelength Division Multiplexer, U.S. Pat. No. 5,283,845 to Ip, entitled Multi-Port Tunable Fiber Optic Filter, and U.S. Pat. No. 5,438,579 to Eda et al., entitled Wavelength Stabilizing Apparatus.

SUMMARY OF THE INVENTION

It is an object of the present invention to provide a WDM optical transmission system which enables each laser to automatically find its operating wavelength and adjust its output power.

It is another object of the present invention to provide a WDM optical transmission system which controls the transmitter lasers to maintain the stable operation at the standardized frequencies to the end of the system's lifetime.

It is still another object of the present invention to provide a WDM optical transmission system which prevents the reduction of the system margin resulting from the wavelength drift.

It is a further object of the present invention to provide a WDM optical transmission system which prevents the crosstalk resulting from the wavelength drift.

It is further another object of the present invention to provide a WDM optical transmission system which simplifies the installation and maintenance thereof.

It is further another object of the present invention to provide a WDM optical transmission system with a device for generating the standardized laser frequencies.

The inventive WDM system utilizes DFB lasers and passive optical demultiplexers. The DFB lasers are tested under normal operating conditions (e.g., biased at 40 mA at 25° C.) and are wavelength-selected for each channel. The criteria for the wavelength selection are to have the laser operating within one half of the channel spacing from the standardized wavelength. However, these lasers are not necessarily tuned to the standardized wavelengths in the factory or in the field. Thus, for the cold start operation, each laser is able to automatically find its operating wavelength without any prior knowledge of its operating conditions for the standardized wavelength. In addition, this system may simultaneously adjust the output power of each laser to a desired value. Of course these lasers must operate at the standard frequencies to the end of the system's lifetime.

According to one aspect of the present invention, a WDM optical transmission system comprises: a reference providing device for providing equally-spaced references at standardized frequencies, a plurality of DFB transmitter lasers for operating near the standardized frequencies for different channels, a passive optical multiplexer for multiplexing the outputs of the DFB lasers, a controller for controlling the DFB laser to automatically operate at the standardized frequencies to generate outputs of desired levels, and a passive optical demultiplexer for demultiplexing the WDM output of the passive optical multiplexer.

The reference providing device is achieved by employing a solid etalon filter. A part of the output of the passive multiplexer is delivered to the etalon filter to provide references at the standardized wavelengths. The remaining part is delivered to the demultiplexer. If the multiplexer has only one output, a 2×2 star coupler is added to generate two outputs. The controller includes a photo-detector for converting the optical output signal of the etalon filter into an electrical signal, a phase-sensitive detector for detecting the first derivative signal from the etalon filter, and a control circuit for changing the operating temperature of the DFB lasers so as to conform their frequencies to the resonant frequencies of the etalon filter according to the first derivative signal obtained from the phase-sensitive detector.

If the output signal of the phase-sensitive detector is zero and has negative slope, the frequency of the laser is considered to conform to the corresponding resonant frequency of the etalon filter, since the phase-sensitive detector receives the first derivative signal of the etalon filter as the input according to the laser frequency. The controller controls the phases sensitive detector to generate a zero output with a negative slope. In addition, a current control circuit consisting of a proportional amplifier and an integrator is provided to precisely adjust the bias current of each laser by processing the first derivative signal, so that the laser frequency is locked to the desired resonant peak when the laser frequency approaches the corresponding resonant frequency.

The present invention will now be described more specifically with reference to the drawings attached only by way of example.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENT

The etalon filter used in the present invention should provide resonant frequencies conforming to the standardized frequencies recommended by the ITU. The "m"th resonant frequency $v_m$ is given by the following formula:

$$V_m = mL = mC/(2nI \cos \theta) \qquad \text{Formula 1.}$$

where m represent the mode number, L is the free spectral range (FSR), C is the speed of light, n is the refractive index, I is the thickness of the filter, and $\theta$ is the incident angle of the optical signal.

A solid-type etalon filter is preferably used because of this simple structure and mechanical stability. However, it is very hard to readily manufacture the etalon filter to meet the requirement of thickness and refractive index. Hence, this requirement may be met by adjusting the incident angle. The incident angle is adjusted by using two master reference lasers. For example, the incident angle $\theta$ is adjusted to make the etalon filter have k+1 resonant frequencies between the upper and lower resonant frequency limits $v_m$ and $v_{m-k}$ conforming to the master frequencies $v_1$ and $v_2$. The adjustment of the incident angle $\theta$ changes the mode number m and FSR L to satisfy the requirement of thickness and refractive index.

The synchronized etalon filter is used to provide the standardized frequencies, and such an etalon filter is disclosed in an article entitled as "Synchronized Etalon Filters for Standardizing WDM Transmitter Laser Wavelengths" by Y. C. Chung and L. W. Shulz, *IEEE PHOTONICS TECHNOLOGY LETTERS*, Vol. 5, No. 2, pp. 186–189, February 1993 and also disclosed in U.S. Pat. No. 5,434,877 entitled "Synchronized Etalon Filters" granted to Y. C. Chung on Jul. 18, 1995. The etalon filter has the incident angle adjusted by using two master frequencies of the lasers locked to Kr transitions to compensate for the differences of thickness and refractive index. Thus, the resonant frequency of the filter is fixed at a value, e.g., 195.575±n×0.1034 Thz.

Thus, the physical characteristics of the atom determine the resonant frequency of the etalon filter. In this case, if the resonant frequency of the filter does not conform to the standardized frequency recommended by the ITU, this method has no value. Hence, in the present invention, a commercial wavemeter is used to lock the frequency of the laser.

Since the ITU has not made its final recommendation yet, we assume that the standardized wavelengths for WDM systems are 193.686±n×0.100 THz, where n represents the channel number. Solid etalons are constructed by coating both sides of 1.04 mm-thick polished fused-silica glasses with multiple layers of $TiO_2/SiO_2$.

The etalons are calibrated by using two master reference lasers. One laser is frequency-locked to the Kr $1s_2$-$2p_8$ transition at 1.54782 μm (193.686 THz). The other laser is frequency-locked at 1.56072 μm (192.086 THz) using a wavemeter. This makes the channel spacing exactly 100 GHz. The resonant frequencies of the etalon were monitored directly by using a broadband light source and an optical spectrum analyzer. In this way, 17 channels are established between these two absolute references. The incident angle was adjusted to match the (m)th and (m+16)th modes of the etalon to the absolute references at 1.54782 μm and 1.56072 μm, respectively. In this case, the mode number "m" is 1936 and FSR 100 GHz.

Figure 7:
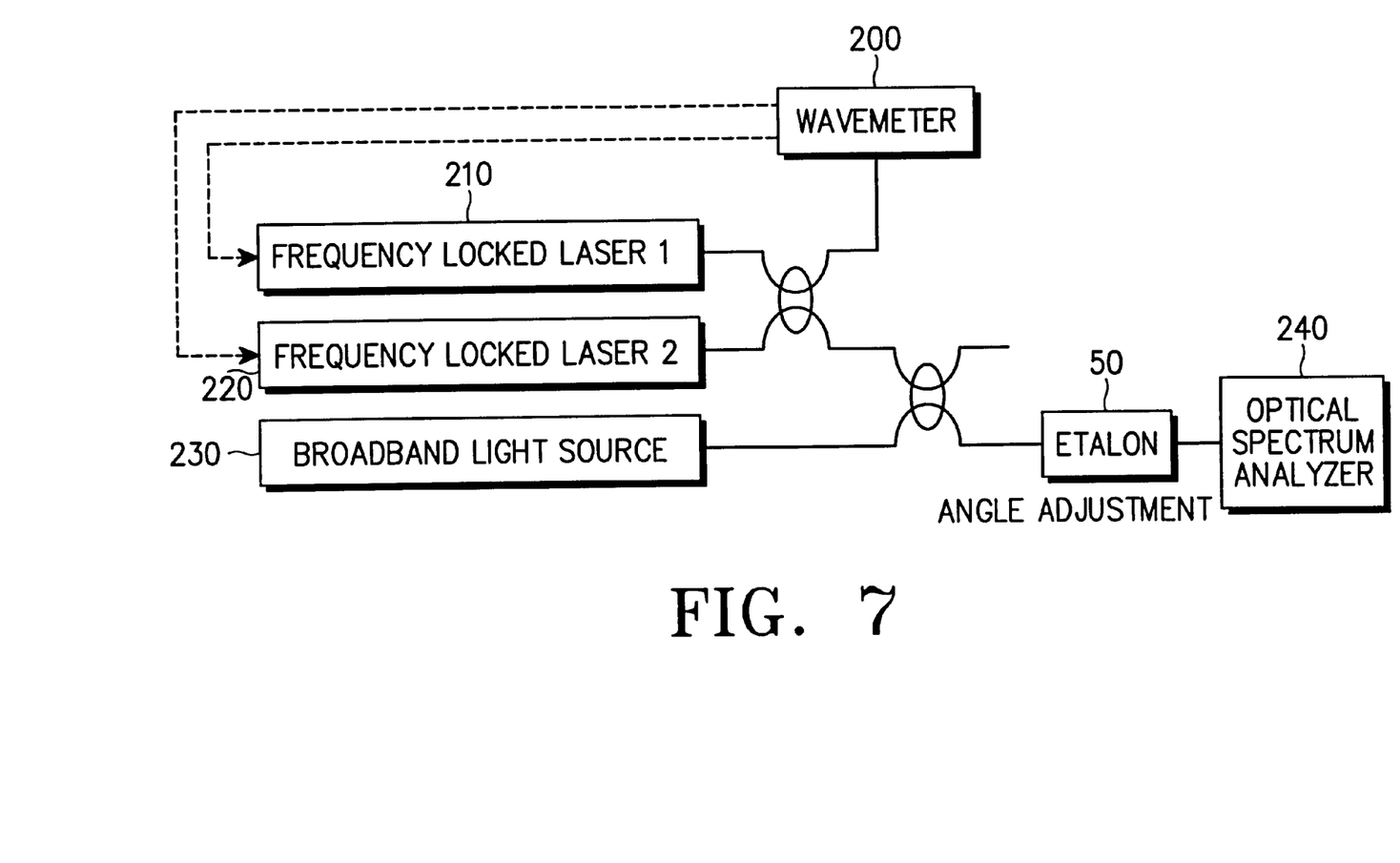
FIG. 7 illustrates a device for adjusting the resonance frequency of an etalon filter, in accordance with the principles of the present invention.

The synchronization of the etalon 50 shall now be described in more detail. The FIG. 7 illustrates a device for adjusting the resonance frequency of the etalon filter 50. Here, the wavemeter 200 is used for stabilizing the two lasers 210 and 220. The stabilized lasers 210 and 220 are used as absolute references for synchronization of the etalon filter 50. In fact, it would be possible to make an etalon which provides any set of equally-spaced references by using both master reference lasers frequency-locked to any desired wavelengths with a wavemeter. In this invention, we established seventeen channels between these two absolute references. To examine the resonance mode of the etalon filter 50, a broadband light source 230 and optical spectrum analyzer 240 are used. For synchronization of the etalon 50, firstly we can adjust the incident angle of the etalon filter 50 so that there happen seventeen resonance modes between the two reference frequencies by using the optical spectrum analyzer 240. Secondly, we can make the output of laser #2 (220) having passed the etalon to have its maximum value by making the "m"-th resonance frequency equal to the reference frequency of laser #2 (220). In this case, the output of the laser having passed the etalon varies according to the value "m". Maintaining the above conditions, namely "seventeen resonance modes between the absolute references" and "the maximum value of the output of the reference laser #2 (220)", we can adjust the incident angle of the etalon 50 precisely for the output of the reference laser having passed the etalon 50 to have its maximum value.

Figure 6:
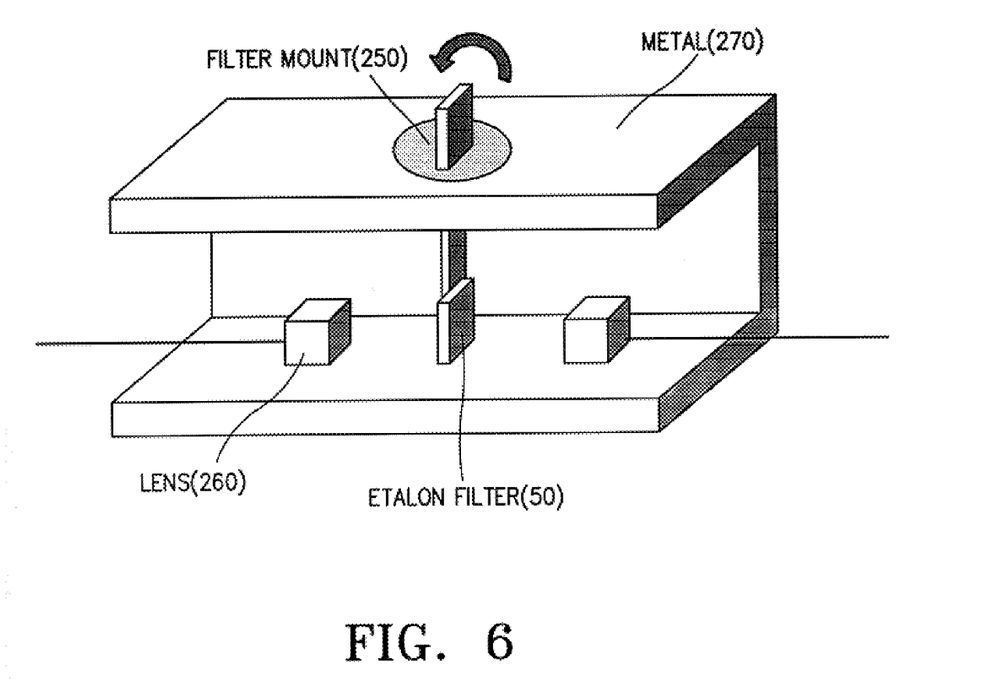
FIG. 6 shows an etalon filter fixed to a metal support, in accordance with the principles of the present invention.

The etalon filters mounted on a support made of a metal such as Duralumin, whose adjustment part is oxidized with an oxidizing agent such as hydrochloric acid to permanently fix the desired incident angle after adjustment. The method of fixing the etalon filter 50 to a support shall now be described in more detail. There needs to be a very precise adjustment of an incident angle to make the resonance frequency of the etalon 50 equal to the reference (or standard) frequency. For this purpose, the module is embodied as shown in FIG. 6. Firstly, the etalon filter 50 is fixed to the filter mount 250 made of metal and two lenses 260 are used for incidenting optical signal into the filter mount 250 having the structure shown in FIG. 6. At this time, the metal support is used for fixing the filter mount between the two lenses. Accordingly, we can adjust the incident angle of the etalon filter precisely by rotating the filter mount 250 fixed on the metal support 270. We can adjust the incident angle of the etalon filter 50 to make the resonance frequency of the etalon 50 equal to the reference (or standard) frequency and we can fix the incident angle permanently by fixing the filter mount 250 on the metal support 270 with an oxidized agent.

Figure 1:
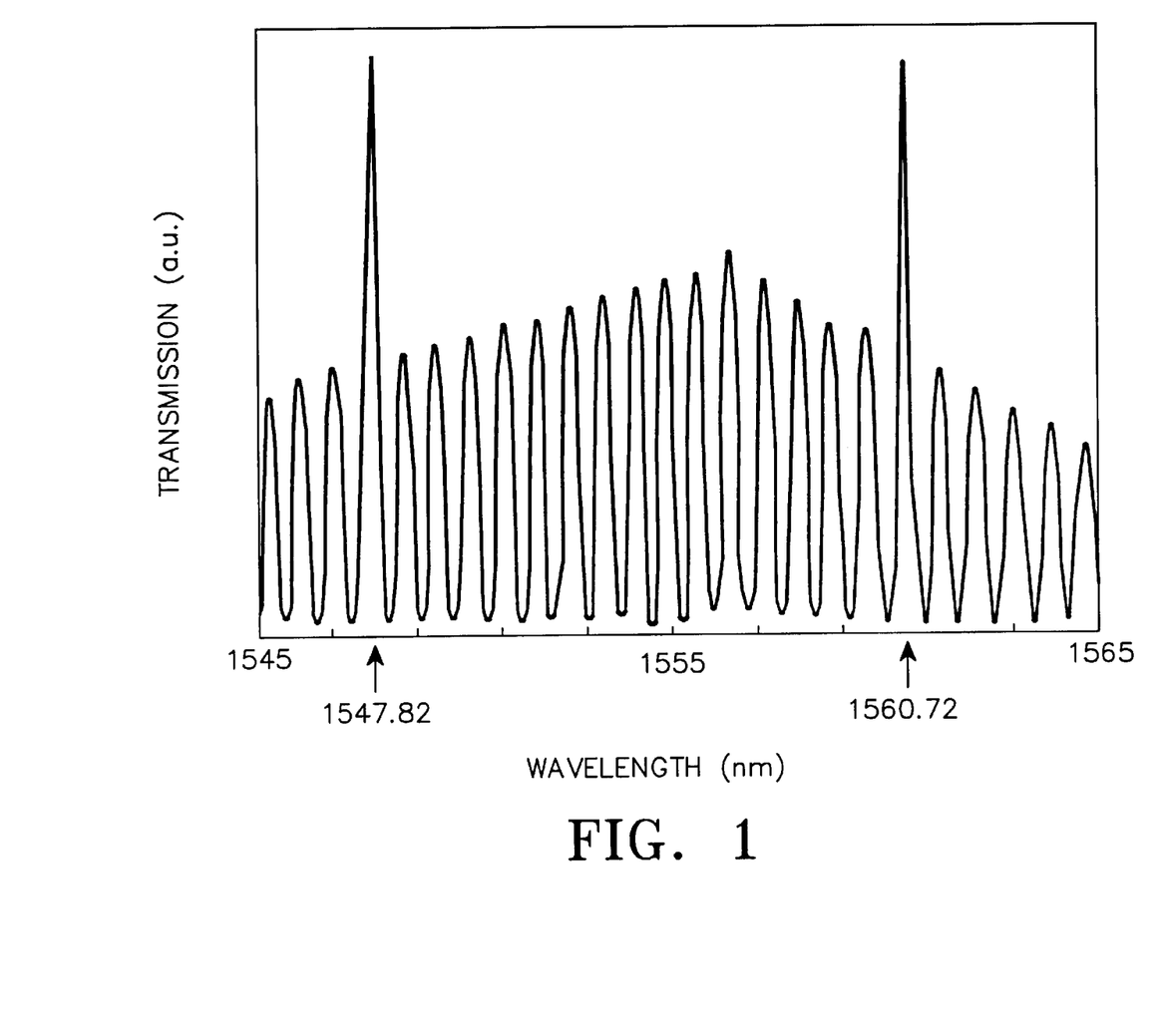
FIG. 1 is a graph illustrating the transmission characteristics of the etalon filter to provide references at the standardized wavelength.

FIG. 1 shows the transmission characteristics (optical spectrums) of the etalon filter when the incident angle was adjusted to satisfy the above conditions. The two highest peaks represent the absolute references obtained from the frequency-locked lasers. The result shows that this synchronized etalon filter provides references at the standardized wavelengths of 193.686±n×0.100 THz. In fact, it would be possible to make an etalon filter which provides any set of equally-spaced references by using both master reference lasers frequency-locked to any desired wave lengths recommended by the ITU with wavemeters.

Figure 2:
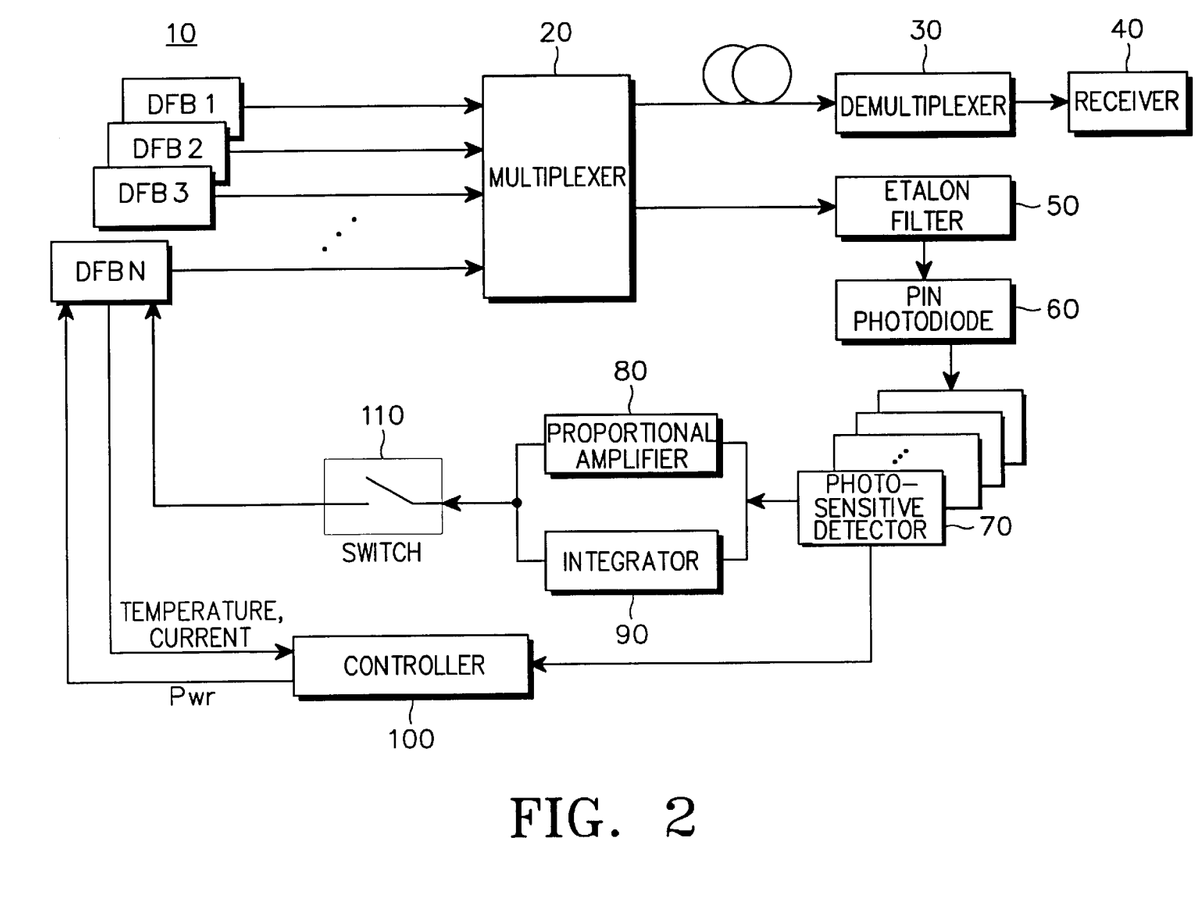
FIG. 2 is a schematic diagram illustrating a cold-start WDM optical transmission system according to the present invention.

There is shown in FIG. 2 a four-channel cold start WDM system. Whose standardized wavelengths were selected to be 1547.82±n×0.8 nm (193.686±n×0.100 Thz) where n is the channel number.

Figure 3:
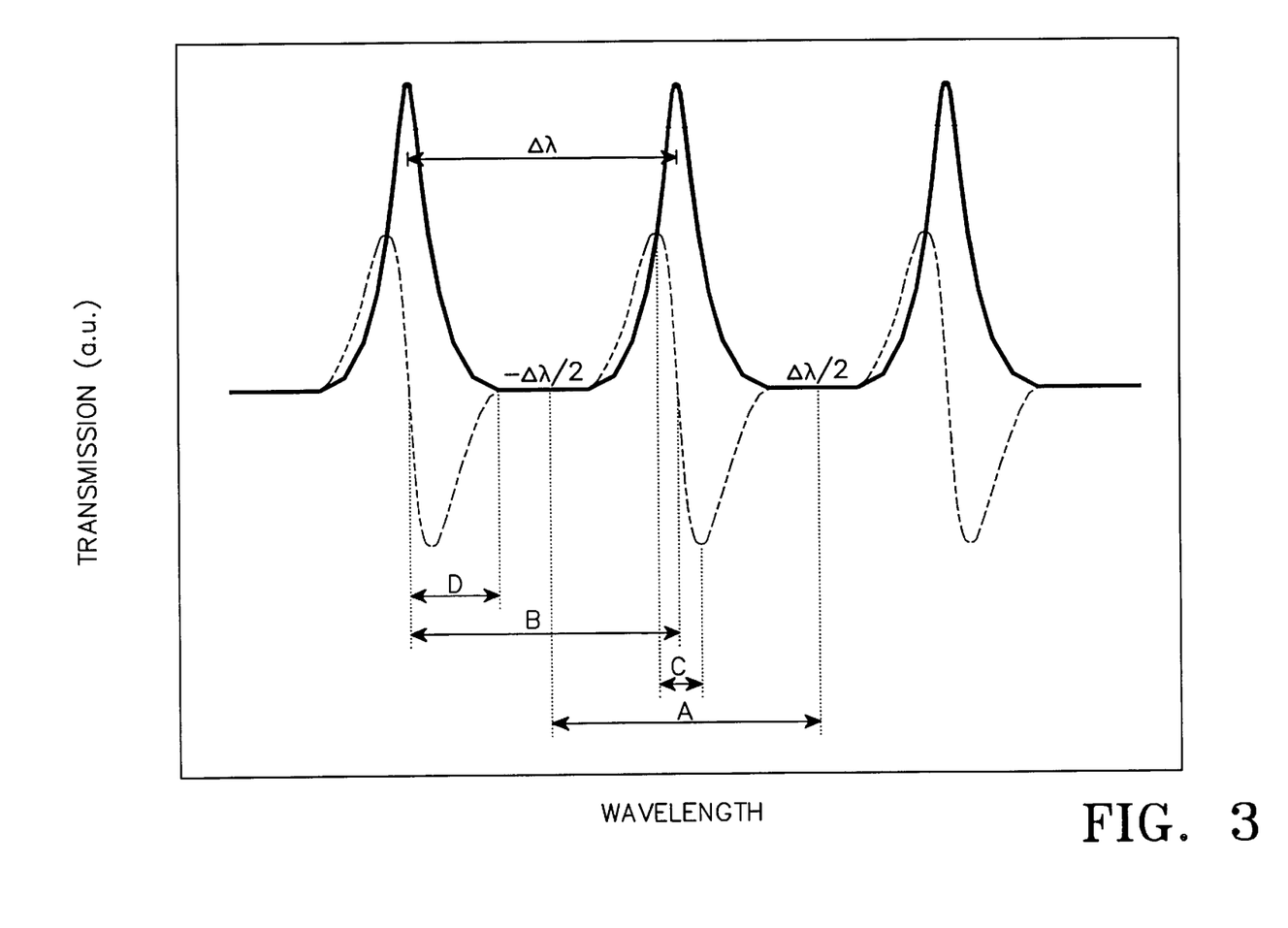
FIG. 3 is a graph illustrating the first derivative signal of the synchronized etalon filter obtained from the phase-sensitive detector and the transmission characteristics of the filter according to the present invention.

FIG. 3 shows a transmission curve of the synchronized etalon filter. The dotted line represents the first derivative signal of the lasers to these resonance peaks (for example, within the region A in FIG. 3) under normal operating conditions could be "wavelength-selected" for their corresponding channels. In this case, four lasers were selected operating at 1552.97, 1553.61, 1554.61, and 1555.24 nm, at 40 mA and 25° C. Their corresponding channel numbers, n, were from 6 to 9.

Figure 4:
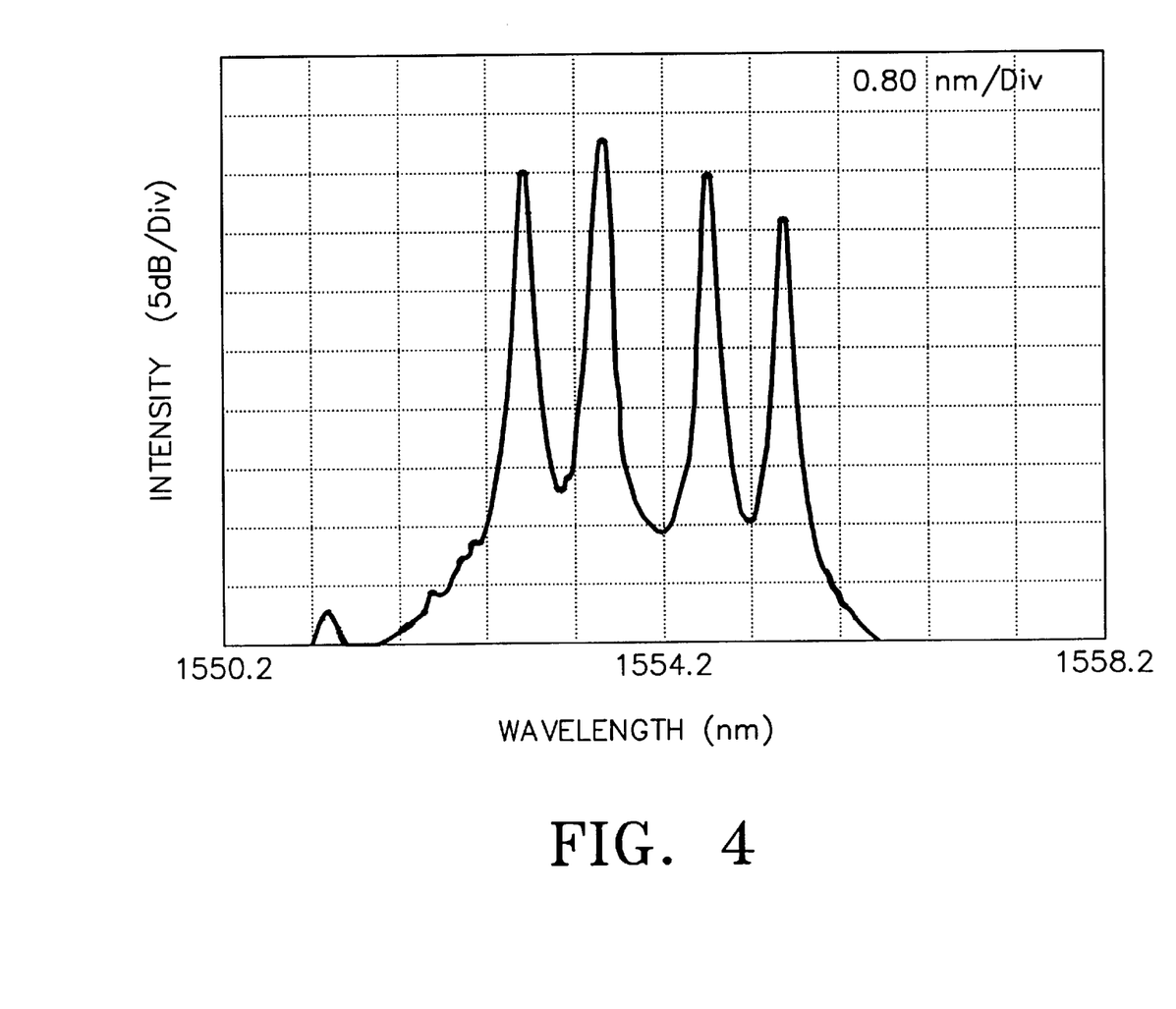
FIG. 4 is a graph illustrating the spectrums of the transmitter lasers measured before the cold start according to the present invention.

FIG. 4 shows the optical spectrum of four wavelength-selected DFB lasers at the normal operating conditions, i.e., every laser being biased at 40 mA at 25° C. before the cold-start control. Although each laser was operating within one half of the channel spacing (±0.4 nm) from the corresponding standardized wavelength, both the channel spacing and the output powers were quite irregular. In order to eliminate such irregularity, the cold start WDM optical transmission system was operated. The DFB lasers were modulated simultaneously at 5 to 8 kHz, respectively, by adding a small sinusoidal current to the injection current. This was necessary not only to obtain the first-derivative signal, but also to identify each channel. This also reduced stimulated Brillouin scattering. The outputs of these laser were coupled into a 4×4 star coupler 20, having one output fiber which was sent to the receiver via a transmission fiber and having another output fiber which was directed to the synchronized etalon filter 50. The 4×4 star coupler served the multiplexer. If the multiplexer has only a signal output as the integrated optic waveguide grating, we may obtain two outputs necessary for the controlling and transmission by adding a 2×2 star coupler. The signal from the etalon filter 50 was sent to a PIN photodiode 60 that was connected to four phase-sensitive detectors. The control mechanism of the WDM optical transmission system is achieved by the PIN photodiode 60, phase-sensitive detectors 70, proportional amplifier 80, integrator 90, switch 110 and controller 100.

Initially, in the cold-start WDM optical transmission system, the control loop set the bias current and the operating temperature of each laser to be 40 mÅ and 20° C., which is five degrees lower than its normal operating temperature. This was to set the wavelength of each laser in the region B in FIG. 3 with the system's channel interval of 100 GHz. The temperature-tuning coefficients of DFB lasers were quite uniform at 10 GHz/° C.

The controller 100 is controlled so as to increase progressively the operating temperature of each laser so as to move the frequency to the region where the output value of the phase-sensitive detector becomes positive. This was to prevent any laser from operating in the region D in FIG. 3 at the initial conditions to be locked in the wrong channel. Then, the output power of each laser was automatically adjusted to 0 dBm by using the optical output sensing signal Pwr of the photodiode built in the laser package. Then, the operating temperature of each laser was increased progressively until the laser was confirmed to be operating in the region C in FIG. 3.

The control loop recognized that the laser was operating in the region C when the first derivative signal decreased as the operating temperature increased. Once the laser was confirmed to be operating in the region C, the controller 100 automatically turned on the switch 110 to activate the current control circuit consisting of the proportional amplifier 80 and integrator 90. This, in turn, adjusted the bias current of each laser to lock the laser frequency to the desired resonant peak. However, as the bias current adjustment also changed the output power of the laser, the output power was readjusted to 0 dBm by changing the temperature.

Figure 5:
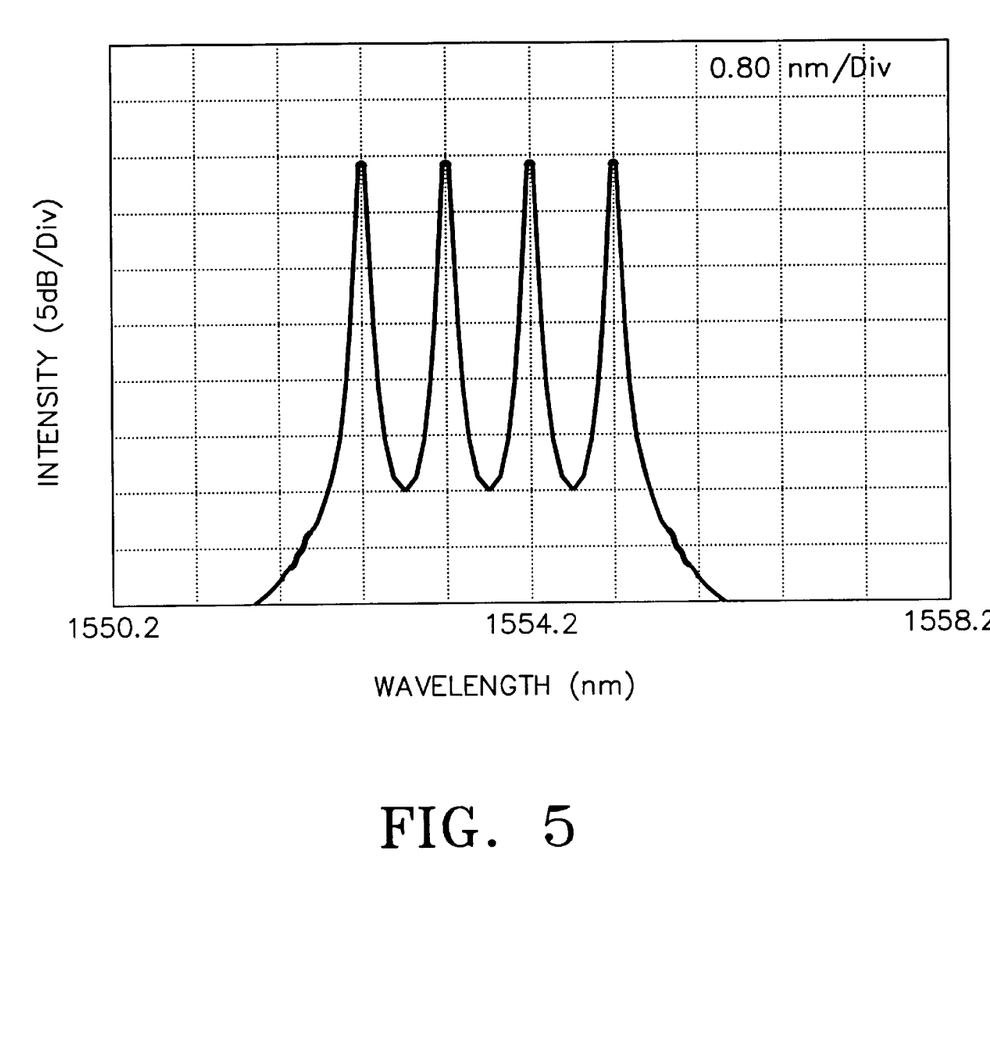
FIG. 5 is a graph illustrating the spectrums of the transmitter lasers measured after the cold start according to the present invention.

FIG. 5 shows the optical spectrum of four DFB lasers obtained by this procedure. The channel spacing and output power were measured to be 100±1 Ghz and 0±0.1 dBm, respectively. There was no human intervention after turning in the system's power supply. The error-free transmission (BER<$10^{-9}$) was achieved within 20 s with the receiver sensitivity of −32 dBm at 2.5 Gb/s. The long term stability was assured by the continuous monitoring and adjustment of the laser wavelength and output power. In addition, if the system is stopped owing to an interruption of the power, etc., the operating conditions of the lasers stored in a memory may be used to restore the system. Hence, the cold start needs to be restarted only when the transmitter lasers are replaced.

In conclusion, the inventive cold-start WDM optical transmission system can start data communication without any manual adjustment of laser wavelengths or optical powers. This system is advantageous because there is no need to precisely adjust the wavelengths of WDM lasers in the factory or in the field, thus simplifying the installation and maintenance of the WDM systems. In addition, the continuous adjustment of each laser to operate at its standardized wavelength improves the reliability of WDM systems. Finally, use of cold-start laser control may reduce the cost of the DFB lasers usable in WDM systems by allowing a relaxed wavelength-selection procedure.

Although the present invention has been described in connection with the specific embodiments and the accompanying drawings, it will be readily apparent to those skilled in the art that various modifications and changes thereof may be made without departing from the gist of the present invention.

What is claimed is:

1. An optical transmission apparatus, comprising:
   a plurality of lasers operating near standardized frequencies for different channels, each of said lasers having at least one output outputting optical signals;
   a multiplexer having a plurality of inputs and at least one output, each one of said inputs being connected to a respective one of said outputs of said lasers, said multiplexer multiplexing said signals output from said lasers and outputting said multiplexed signals from said at least one output of said multiplexer;
   an etalon filter being connected to said at least one output of said multiplexer, said etalon filter receiving said multiplexed output signals from said at least one output of said multiplexer, said etalon filter outputting equally spaced references at said standardized frequencies in dependence upon said signals received from said multiplexer;
   a controller being connected to said etalon filter, said controller controlling said lasers in dependence upon signals received from said etalon filter, said controller controlling said lasers to automatically operate at said standardized frequencies to generate outputs of predetermined levels;
   a demultiplexer receiving said multiplexed output signals from said at least one output of said multiplexer, said demultiplexer demultiplexing said multiplexed output signals; and
   a receiver receiving said demultiplexed signals from said demultiplexer.

2. The apparatus of claim 1, said multiplexed signals output from said multiplexer corresponding to wavelength division multiplexed signals.

3. The apparatus of claim 2, said plurality of lasers corresponding to a plurality of distributed feedback lasers.

4. The apparatus of claim 3, said controller controlling said lasers in dependence upon detected characteristics of said lasers.

5. The apparatus of claim 4, said detected characteristics including a temperature of each of said lasers.

6. The apparatus of claim 4, said etalon filter corresponding to a solid etalon filter.

7. The apparatus of claim 6, said controller further comprising:
   a phase-sensitive detector detecting a first derivative signal from said etalon filter; and
   a control circuit changing an operating temperature of said lasers so that frequencies of said lasers respectively correspond to resonant frequencies of said etalon filter according to the first derivative signal detected by said phase sensitive detector.

8. The apparatus of claim 7, said controller automatically operating a current control circuit to lock said frequencies of said lasers to said resonant frequencies when said lasers operate near said resonant frequencies.

9. The apparatus of claim 8, further comprising two frequency-locked lasers, said two frequency-locked lasers being absolute references for synchronization of said etalon filter.

10. The apparatus of claim 9, said etalon filter being calibrated by using said two frequency-locked lasers.

11. The apparatus of claim 9, said two frequency-locked lasers compensating for differences of thickness and refractive index of said etalon filter.

12. The apparatus of claim 9, said etalon filter having an incident angle adjusted by using said two frequency-locked lasers.

13. The apparatus of claim 12, said adjusted incident angle corresponding to predetermined characteristics.

14. The apparatus of claim 13, said two frequency-locked lasers including a first frequency-locked laser and a second frequency-locked laser, said first frequency-locked laser being frequency locked to a first reference frequency, said second frequency-locked laser being frequency locked to a second reference frequency, said predetermined characteristics corresponding to seventeen resonance modes between said first and second reference frequencies.

15. The apparatus of claim 14, further comprising a wavemeter for stabilizing said two frequency-locked lasers.

16. The apparatus of claim 12, a position of said etalon filter being fixed to permanently maintain said adjusted incident angle, said etalon filter having resonant frequencies respectively corresponding to said standardized frequencies.

17. The apparatus of claim 16, further comprising a support having an adjustment part adjusting an angle of said support, said etalon filter being mounted on said support, an oxidizing agent being used to oxidize said adjustment part to obtain, fix, and permanently maintain said adjusted incident angle.

18. The apparatus of claim 17, said support being formed of metal.

19. The apparatus of claim 9, further comprising a wavemeter for frequency-locking said two frequency-locked lasers.

20. The apparatus of claim 9, further comprising two wavemeters, each respective one of said two wavemeters stabilizing a respective one of said two frequency-locked lasers.

21. The apparatus of claim 20, a position of said etalon filter being fixed to permanently maintain said adjusted incident angle, said etalon filter having resonant frequencies respectively corresponding to said standardized frequencies.

22. The apparatus of claim 21, further comprising:
   a support having an adjustment part adjusting an angle of said support; and
   an oxidizing agent;
   said etalon filter being mounted on said support, said oxidizing agent being used to oxidize said adjustment part to obtain an incident angle corresponding to predetermined characteristics.

* * * * *